(12) United States Patent
Fink et al.

(10) Patent No.: US 8,092,602 B2
(45) Date of Patent: Jan. 10, 2012

(54) THERMALLY ZONED SUBSTRATE HOLDER ASSEMBLY

(75) Inventors: Steven T. Fink, Mesa, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 188 days.

(21) Appl. No.: 11/961,355

(22) Filed: Dec. 20, 2007

(65) Prior Publication Data
US 2008/0092818 A1    Apr. 24, 2008

Related U.S. Application Data

(63) Continuation of application No. 10/721,500, filed on Nov. 26, 2003, now Pat. No. 7,347,901.

(60) Provisional application No. 60/429,540, filed on Nov. 29, 2002.

(51) Int. Cl.
*C23C 16/00* (2006.01)
*C23C 16/46* (2006.01)

(52) U.S. Cl. ............. 118/724; 156/345.52; 156/345.53; 118/725; 118/728

(58) Field of Classification Search .................. 118/724, 118/728, 725; 156/345.52, 345.53
See application file for complete search history.

(56) References Cited

U.S. PATENT DOCUMENTS

| | | | |
|---|---|---|---|
| 5,078,851 A | 1/1992 | Nishihata et al. | 204/298.34 |
| 5,234,527 A | 8/1993 | Nozawa et al. | 156/345.27 |
| 5,810,933 A | 9/1998 | Mountsier et al. | |
| 5,846,375 A | 12/1998 | Gilchrist et al. | 156/345.52 |
| 5,937,142 A | 8/1999 | Moslehi et al. | 392/416 |
| 6,392,205 B1 * | 5/2002 | Minonishi | 219/443.1 |
| 6,465,763 B1 * | 10/2002 | Ito et al. | 219/444.1 |
| 6,558,508 B1 | 5/2003 | Kawakami | |
| 6,581,275 B2 * | 6/2003 | Narendrnath et al. | 29/825 |
| 6,664,738 B2 | 12/2003 | Arai et al. | 315/111.21 |
| 6,723,202 B2 | 4/2004 | Nagaiwa et al. | 118/715 |
| 6,740,853 B1 | 5/2004 | Johnson et al. | 219/444.1 |
| 6,753,272 B1 | 6/2004 | Lee et al. | 438/795 |
| 6,847,014 B1 | 1/2005 | Benjamin et al. | 219/444.1 |
| 6,949,719 B2 | 9/2005 | Suenaga et al. | 219/390 |
| 6,949,722 B2 | 9/2005 | Strang et al. | 219/444.1 |
| 6,951,587 B1 * | 10/2005 | Narushima | 118/728 |
| 7,033,444 B1 | 4/2006 | Komino et al. | |
| 7,274,004 B2 * | 9/2007 | Benjamin et al. | 219/444.1 |

(Continued)

FOREIGN PATENT DOCUMENTS

JP    58-182818    10/1983

(Continued)

OTHER PUBLICATIONS

Office Action issued Dec. 7, 2010, in Japan Patent Application No. 2006-528000.

(Continued)

*Primary Examiner* — Sylvia R. MacArthur
(74) *Attorney, Agent, or Firm* — Oblon, Spivak, McClelland, Maier & Neustadt, L.L.P.

(57) ABSTRACT

A thermally zoned substrate holder including a substantially cylindrical base having top and bottom surfaces configured to support a substrate. A plurality of temperature control elements are disposed within the base. An insulator thermally separates the temperature control elements. The insulator is made from an insulting material having a lower coefficient of thermal conductivity than the base (e.g., a gas- or vacuum-filled chamber).

24 Claims, 12 Drawing Sheets

U.S. PATENT DOCUMENTS

| | | | |
|---|---|---|---|
| 7,347,901 B2 * | 3/2008 | Fink et al. ............ 118/724 |
| 2001/0019472 A1 | 9/2001 | Kanno et al. |
| 2004/0097088 A1 | 5/2004 | Kitayama et al. |
| 2004/0123805 A1 | 7/2004 | Tomoyoshi |
| 2008/0092818 A1 * | 4/2008 | Fink et al. ............ 118/724 |

FOREIGN PATENT DOCUMENTS

| JP | 02-263789 | 10/1990 |
|---|---|---|
| JP | 05-029448 | 2/1993 |
| JP | 09-232415 | 9/1997 |
| JP | 10-150100 | 6/1998 |
| JP | 11-265931 | 9/1999 |
| JP | 2001-068538 | 3/2001 |
| JP | 2001-110883 | 4/2001 |
| JP | 2001-110885 | 4/2001 |
| JP | 2002-217178 | 8/2002 |
| JP | 2002-327275 | 11/2002 |
| JP | 2002-343693 | 11/2002 |
| JP | 2003-179040 | 6/2003 |
| JP | 2003-243490 | 8/2003 |

OTHER PUBLICATIONS

Korean Office Action dated Oct. 1, 2010 in KR Appl. No. 10-2006-7007931 (with English Translation).

Final Rejection (w/ English Translation) dated Jul. 22, 2010 in JP Application No. 2006-528000.

* cited by examiner

THERMALLY ZONED SUBSTRATE HOLDER ASSEMBLY

CROSS-REFERENCE TO RELATED APPLICATIONS

This application is a continuation of and claims the benefit of priority under 35 U.S.C. §120 from U.S. Ser. No. 10/721,500, filed Nov. 26, 2003, which is now U.S. Pat. No. 7,347,901 and is related to and claims priority to U.S. Provisional Application Ser. No. 60/429,540, filed Nov. 29, 2002. The entire contents of these applications are incorporated herein by reference.

BACKGROUND OF THE INVENTION

1. Field of the Invention

The present invention relates generally to a thermally-zoned substrate holder for maintaining the temperature of the surface of a substrate during processing in a plasma system, and more particularly to a substrate holder including thermal insulation separating multiple temperature controlled zones.

2. Discussion of the Background

It is known in semiconductor manufacturing that processing systems often use and, in many cases, require the incorporation of temperature control elements to control both wall and substrate temperatures and ensure robust substrate processing. For example, temperature control elements can include resistance heaters to heat a substrate holder which supports a semiconductor substrate during a processing step or steps, or to heat the chamber walls in order to reduce residue formation during processing. Moreover, temperature control elements can include fluid channels designed to carry either heated or cooled fluid to and from the substrate holder or chamber wall in order to deposit heat in the processing system or extract heat from the processing system. In general, the substrate temperature as well as the chamber wall temperature, and their respective spatial uniformities, can have a profound influence on the process results.

Figure 1:
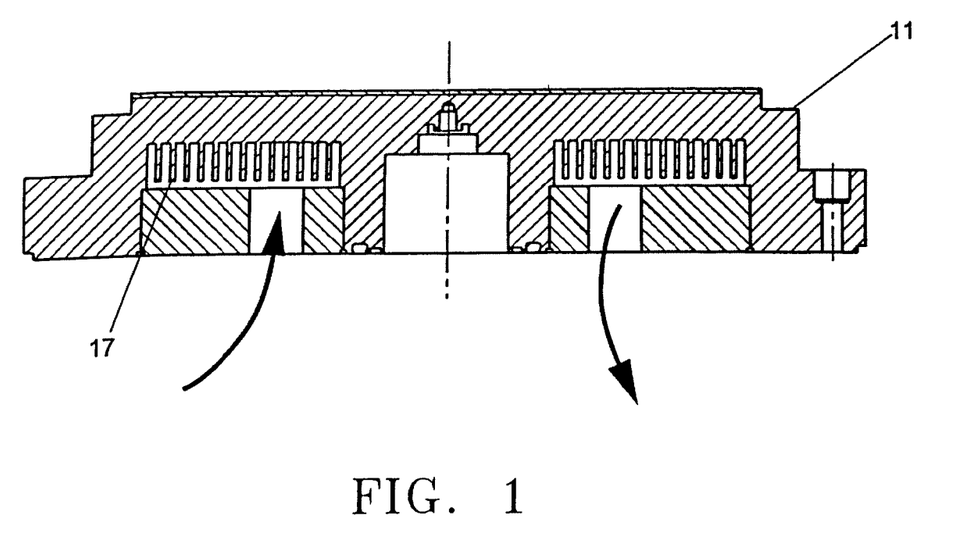
FIG. 1 is a cross-sectional view of a known substrate holder.

One example of a substrate holder comprising temperature control elements is shown in FIG. 1. As illustrated in FIG. 1, a substrate holder 11, typically fabricated from aluminum, includes a temperature control element 17, such as a cooling channel or a heating element which generally takes the form of a loop. In some case, heat transfer fins can extend from an internal surface of the temperature control element 17 in the substrate holder 11 in order to effectively increase the wetted surface area through which heat is exchanged between the substrate holder 11 and the temperature control element 17.

SUMMARY OF THE INVENTION

Therefore, a need exists for an apparatus and method for providing multiple insulated thermal zones in either a metallic or non-metallic substrate holder. A need further exists for such an apparatus and method to be simply and inexpensively installed and maintained.

Accordingly, it is an object of the present invention to create multiple insulated thermal zones in a substrate holder to better tailor features to the cooling and heating processes thereof. The distinctly separate temperature controlled passages and heating elements create multiple temperature zones in the substrate holder that allow the temperature controlling mechanisms in the substrate holder to be utilized effectively.

According to one embodiment of the present invention, a thermally insulating material is inserted between cooling passages to form independently controllable temperature zones. Such thermal insulators can be any material or combination of materials with a low heat transfer coefficient (e.g., air or vacuum).

In addition, reflecting surfaces on the outer surfaces of the thermal insulator can be utilized. These reflective surfaces can be produced in many different ways, including but not limited to foil, sputtering and surface treatments. The reflecting surfaces further hinder the heat transfer characteristics of the thermal insulator.

BRIEF DESCRIPTION OF THE DRAWINGS

A more complete appreciation of the invention and many of the attendant advantages thereof will become readily apparent to those skilled in the art with reference to the following detailed description particularly when considered in conjunction with the accompanying drawings, in which.

DETAILED DESCRIPTION OF THE PREFERRED EMBODIMENTS

Referring now to the drawings wherein like reference numerals designate identical or corresponding parts throughout the several views, FIGS. 2A, 2B, 2C, and 2D illustrate a top view, a side view, a side cross-sectional view, and a bottom view, respectively, of a substrate holder 40 for holding/supporting a substrate (e.g., a semiconductor wafer or a liquid crystal display panel) during processing in a processing environment. The substrate holder 40 includes a first temperature control element 41A and a second temperature control element 41B.

The first and second temperature control elements 41A and 41B are substantially circular. For, example, each temperature control element can comprise a cooling channel for circulating a fluid at reduced temperature, a heating channel for circulating a fluid at elevated temperature, a resistive heating element, an array of thermo-electric coolers, etc. For clarity of presentation, the former temperature control elements (e.g., a cooling channel or heating channel) is exemplified in FIGS. 2C and 2D. Each temperature control element is represented by a temperature controlled cooling (or heating) channel (also referred to as a passageway) formed into the substrate holder 40. An insulator 43 is positioned between the first and second temperature control elements 41A and 41B. The insulator 43 is substantially concentric with the first and second temperature control elements (tce) 41A and 41B. Inlets 44 and outlets 45 (FIG. 2D) provide means for circulating (counterclockwise for tce 41B and clockwise for tce 41A) the fluid (e.g. Flourinert, Galden, HT 135) through each temperature control element 41A, 41B, and in a quantity necessary to maintain the substrate holder 40 within a specified temperature range.

Figure 2A:
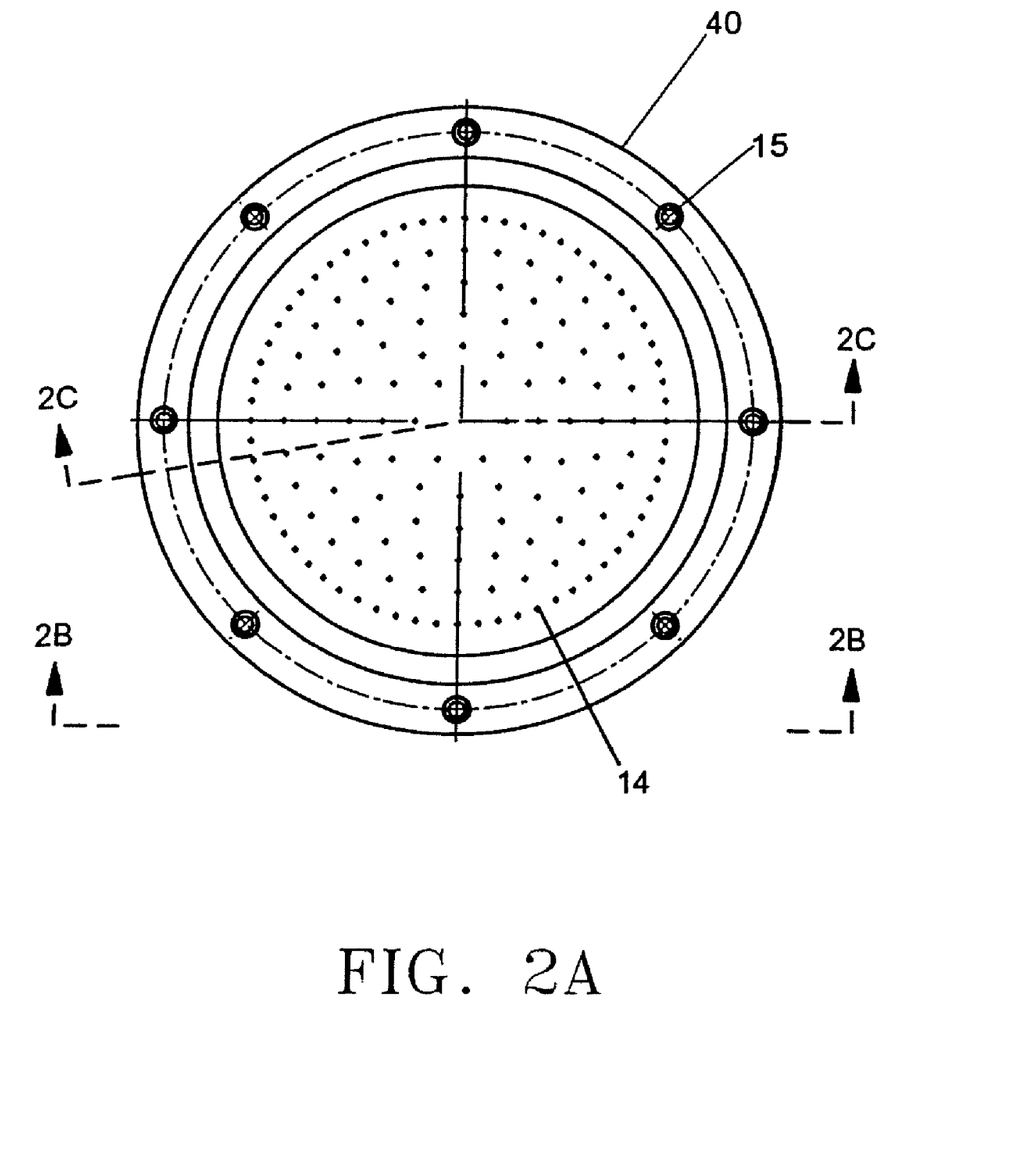
FIG. 2A is a top view of a substrate holder according to the present invention.
Figure 2B:
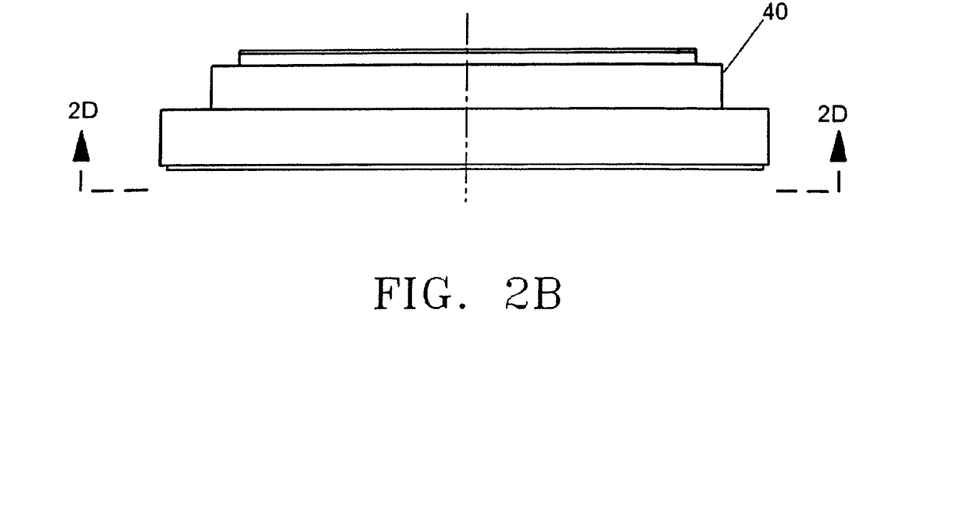
FIG. 2B is a side view of a substrate holder according to the present invention.
Figure 2C:
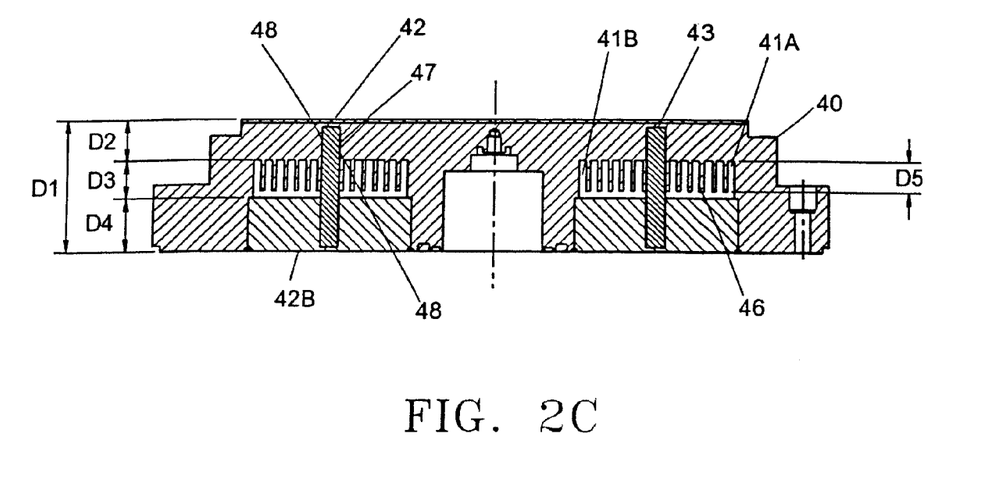
FIG. 2C is a cross-sectional view of a substrate holder according to the present invention.
Figure 2D:
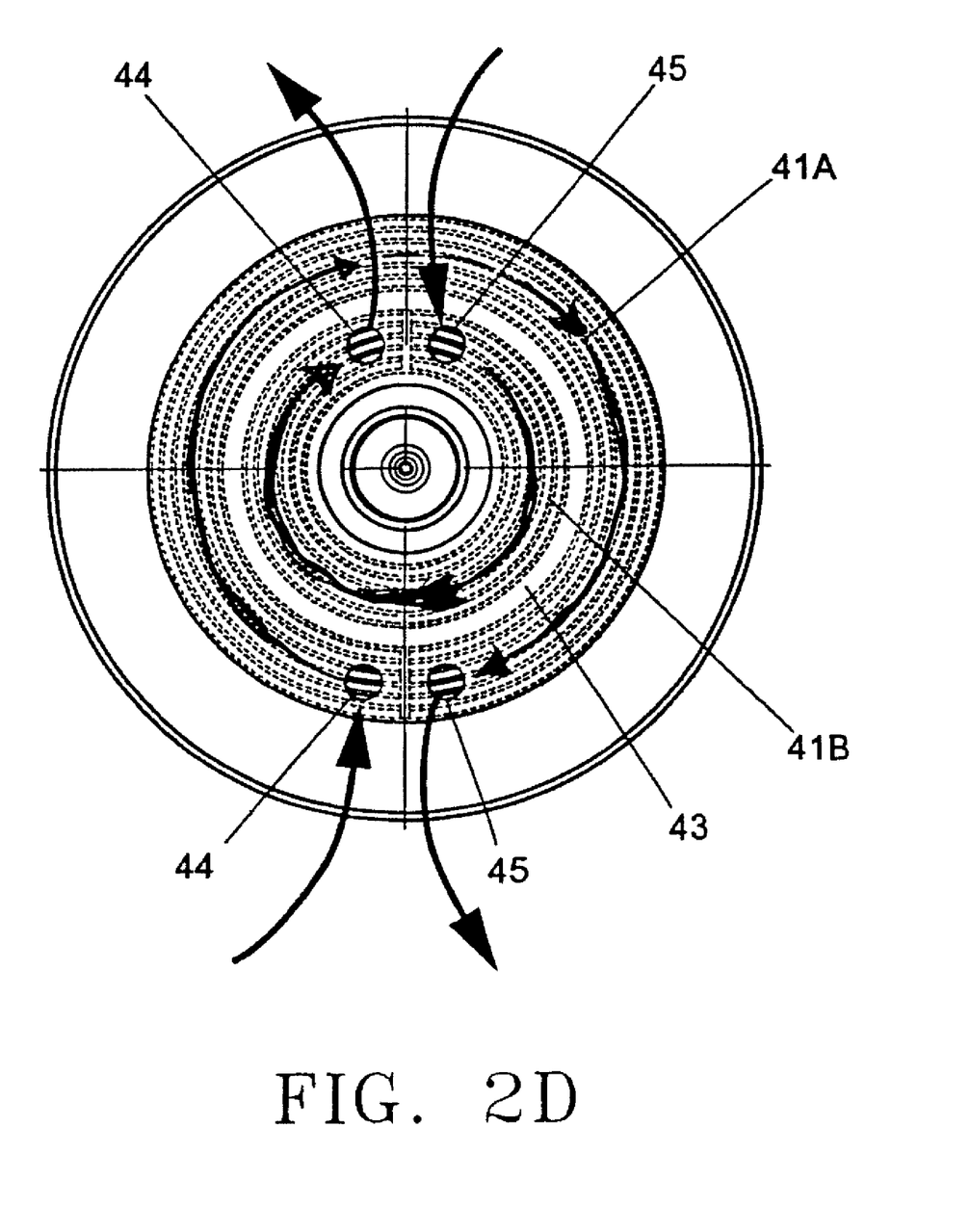
FIG. 2D is a bottom view of a substrate holder according to the present invention.

As shown in FIG. 2C, the temperature control elements 41A and 41B are formed substantially within the center of the substrate holder 40. Preferably, the temperature control elements 41A and 41B should be equidistant from the top of the substrate holder to the bottom of the substrate holder. For example, the substrate holder 40 has a depth from the top surface 42a to the bottom surface 42b of $D_1$. The depths from the top surface 42a to the upper surface of the temperature control elements 41A and 41B and from the bottom surface 42b to the base of the cooling/heating elements 41A and 41B is $D_2$ and $D_4$, respectively. Thus, for example, the height of the temperature control elements 41A and 41B is $D_3$ where $D_3 = D_1 - D_2 - D_4$. However, as will be discussed later, the height of the temperature control element can be variable. Alternately, fin-like projections 46 having a depth $D_5$ can extend towards the base of the temperature control elements 41A and 41B from the upper surface of the temperature control elements 41B and 41B. The fin-like projections 46 provide additional wetted surface area through which heat may be transferred.

A thermal insulator 43 extends from nearly the top surface 42A to nearly the bottom surface 42B. The insulator 43 has a substantially rectangular cross-section where the top end is parallel to the surface 42A and the bottom end is parallel to the surface 42B. The insulator 43 extends in a circle through the substrate holder 40 such that the temperature control elements 41A and 41B are effectively thermally separated from one another. That said, although this invention contemplates that the insulator 43 could extend all the way to the surfaces of the substrate holder 40, it is preferable that a thin layer of substrate holder material remain at least above the insulator. This aids in the structural integrity of the substrate holder 40.

An adhesive 47 can be used to bond the insulator 43 to the substrate holder 40; however, it is not necessary. The adhesive 47 should prevent or substantially decrease leakage across the insulator 43 and maintain a seal for the life of the substrate holder 40. Preferably, the adhesive 47 will also have heat transfer properties similar to the thermal insulator 43. As such, the adhesive 47 can be made of some industrial grade glue, a frit composed of fine alumina mixed with an adhesive, or where a quartz substrate holder is used, a frit composed of quartz powder mixed with an appropriate base vehicle and thinner.

During higher temperature applications where radiative transport becomes more significant, reflecting surfaces 48 may be applied to either side of the insulator 43. The reflecting surfaces 48 further inhibit heat transfer from one side of the insulator 43 to the other side.

Figure 3:
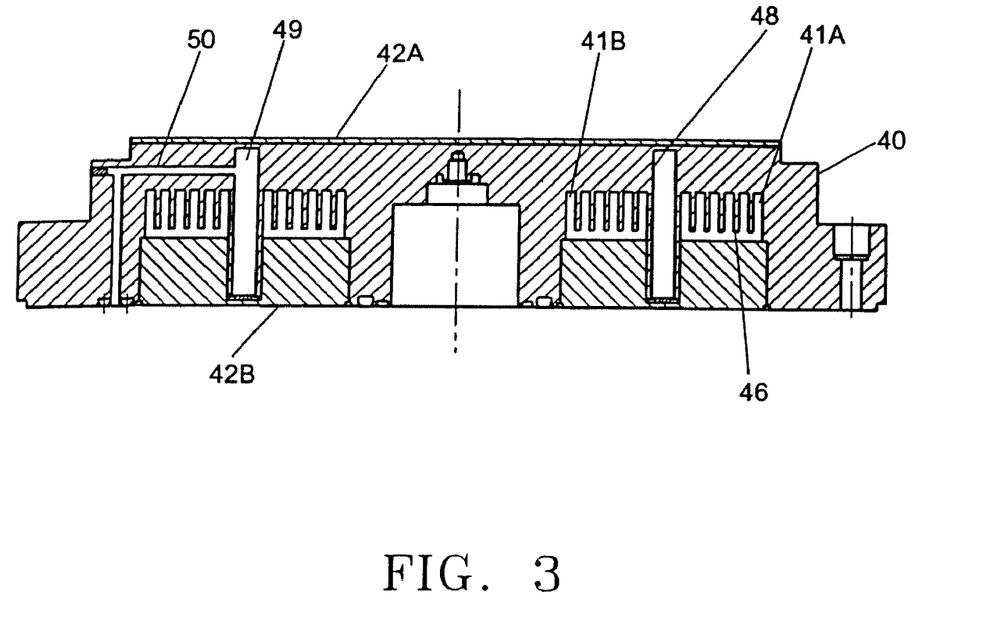
FIG. 3 is a cross-sectional view of an insulator separating plural temperature control elements according to another embodiment.

An alternate embodiment of the present invention is illustrated in FIG. 3. According to this embodiment, an gaseous chamber 49 is shown serving as the insulator. The gaseous chamber 49 is preferably composed of a section of the substrate holder material extending from substantially the top surface 42A to substantially the bottom surface 42B. As above, the gaseous chamber 49 extends in a circle through the substrate holder 40 such that the temperature control elements 41A and 41B are effectively thermally separated from one another.

The space defined by the area inside the gaseous chamber 49 is configured to receive a gas at a predetermined pressure (e.g., atmospheric pressure, vacuum pressure, or above-atmospheric pressure) and temperature. A piping system 50 couples the gaseous chamber 49 to a gas supply with, for example, a pressure regulator and/or a pumping system, other gaseous chambers, and possibly to the atmosphere. The piping system 50 may also connect the gaseous chamber 49 with a gas source extrinsic to the substrate holder so that a gas may be pumped into the air chamber 49.

The insertion of insulator 43 between temperature control elements 41A and 41B can reduce the thermal transfer between the respective thermal zones by an amount in excess of 95%. The amount of heat transfer is related to the effective reduction in thermal conduction between the two or more thermal zones by the insertion of insulator 43. This effective reduction in the thermal conduction between the two thermal zones is primarily attributed to the material properties of the insulator 43 (e.g., thermal conductivity of insulator 43 relative to the thermal conductivity of the material comprising the substrate holder 40), the thickness of insulator 43, and the fraction of area separating the two thermal zones that is occupied by the insulator 43 (e.g., the insulator 43 may not extend entirely to surfaces 42A and 42B in order to retain the structural integrity of the substrate holder 40). For example, given an insulator 43 of thickness equivalent to 2 mm and of height extending to within 1 mm of the upper surface 42A and the lower surface 42B of a 5 cm thick substrate holder 40, the percent reduction in heat transfer between thermal zones is estimated in TABLE I for an insulator 43 comprised of alumina, quartz, helium at standard temperature and pressure (STP), or helium at 1 mTorr. Additionally, as provided in TABLE I, the respective thermal conductivities used for approximating a percent reduction in heat transfer are presented.

TABLE I

| MATERIAL | k (W/m-K) | % REDUCTION |
| --- | --- | --- |
| Aluminum | 237 | NA |
| Alumina | 46 | 77.4 |
| Quartz | 10.4 | 91.8 |
| Helium (STP) | 0.18 | 95.9 |
| Helium (1 mTorr) | 0.00018 | 96 |

Other arrangements of this embodiment include the use of a material different from the substrate holder material to support the gaseous chamber 49. Such material could include any material with heat transfer capabilities less than that of the substrate holder material. For example, the thermal insulating material employed in the first embodiment, assuming that a seal for the gaseous chamber could be maintained.

As in the first embodiment, reflecting surfaces 48 may be applied to the sides of the gaseous chamber 49 to further inhibit heat transfer on one side of the gaseous chamber 49 on the other side.

The result of installing the insulators discussed above is a significantly reduced degree of heat transfer through different zones of the substrate holder 40. To overcome shortcomings associated with a substrate holder having a uniform temperature profile, the substrate holder in the present invention includes at least two thermal zones across the surface 42A which can correspond to the arrangement and shape of the temperature control elements and the insulator(s) installed in the substrate holder. Thus, the effects of temperature gradients can be manipulated as necessary for a particular substrate process.

As shown in FIGS. 2A-D, and 3, the temperature control elements 41A and 41B are concentric elements. These concentric elements can have a constant cross-section along their length, or they can have a non-constant cross-section with length. Alternately, the temperature control elements can be radially extending elements as shown in cross-sectional view in FIG. 4A and in bottom view in FIG. 4B. For example, the radially extending temperature control elements can be fluid channels, each having an inlet 44 at a first radius and an outlet 45 at a second radius.

Figure 4A:
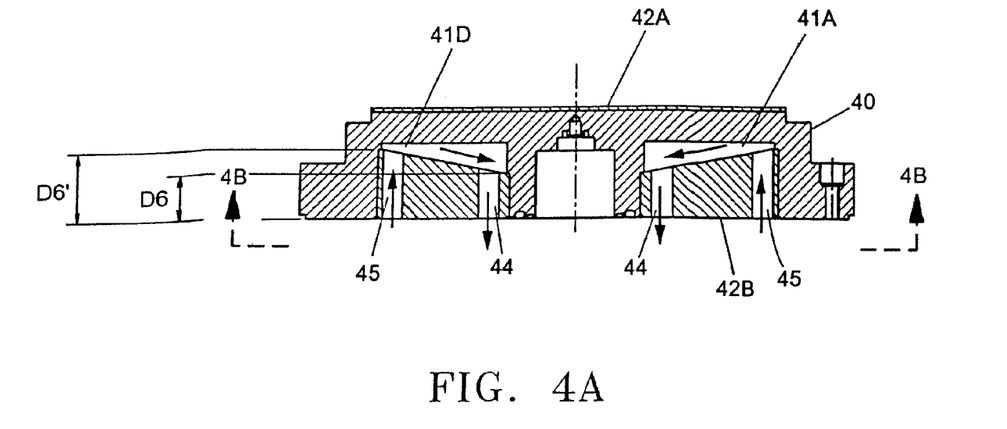
FIG. 4A is a cross-sectional view of a substrate holder according to another embodiment of the present invention.
Figure 4B:
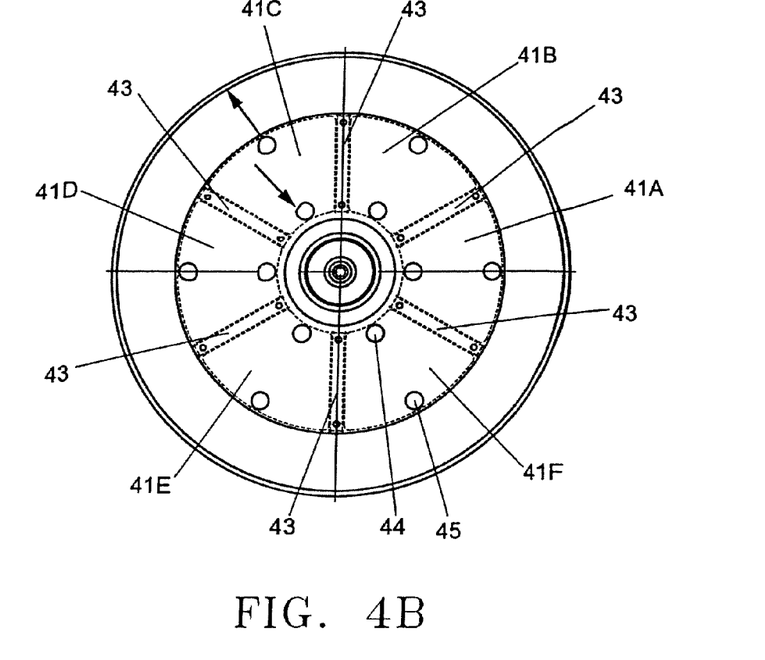
FIG. 4B is a bottom view of a substrate holder according to another embodiment of the present invention.

With reference now to FIG. 4A, a cross section along the side of the temperature control element is shown so as to illustrate a preferable arrangement of the temperature control element 41A and 41D (note, the drawing is not to scale). The inlet 44 and outlet 45 are shown wherein the cooling element depth at the inlet 44 is $D_6$ and the depth at the outlet 45 is $D_6'$. Since the width of the radial spindle increases as one moves radially outward, the depth is decreased from $D_6$ to $D_6'$ in order to maintain the same cooling channel cross-sectional area. Due to mass conservation, the constant area maintains a constant flow velocity. If the depth is maintained constant, then the increase in area would result in a decrease of the flow velocity hence leading to a decrease in the heat transfer coefficient. This is contrasted with what would be a significant reduction in the heat flux associated with the reduction in the flow velocity.

As an example, the coolant flow channels can be maintained throughout with an approximately constant cross-sectional area. This enables the constant, nearly uniform flow throughout. A second order effect in this case is the slight reduction in hydraulic diameter with radius which also increases the heat transfer coefficient (only slightly) these two effects are necessary to aid in achieving a constant heat flux with radius (an increase in the heat transfer coefficient can balance the increase in the cooling temperature). An alternate embodiment includes a decreasing cross-sectional area with an increasing radius. In this case, the insulator 43 can have a constant height $D_1$ along the length of the insulator.

In accordance with this invention, the insulator 43 is shaped independently of the shape of the cooling element. Thus, insulator 43 will have a constant height nearly equal to the height of the substrate holder D, along the entire length of the insulator. Therefore, the insulator maintains a nearly constant level of heat transfer reduction along its entire length.

Figure 5A:
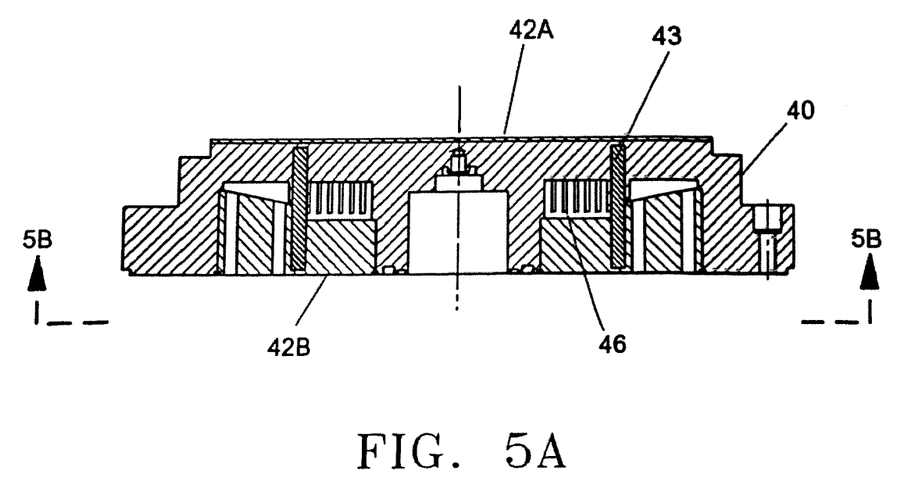
FIG. 5A is a cross-sectional view of a substrate holder according to another embodiment of the present invention.
Figure 5B:
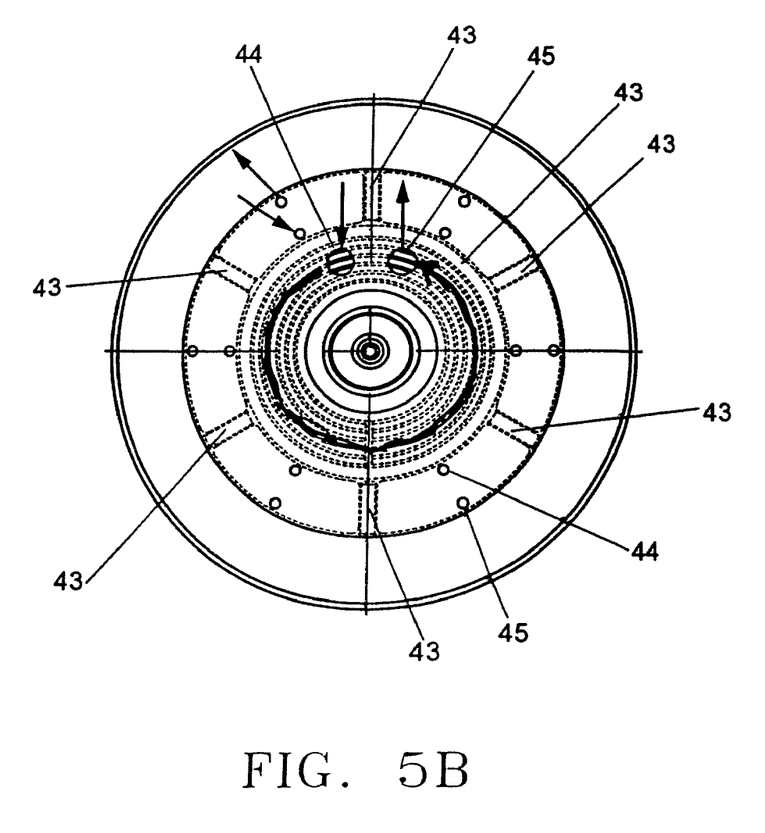
FIG. 5B is a bottom view of a substrate holder according to another embodiment of the present invention.

Alternately, as shown in FIGS. 5A and 5B, substrate holder 40 can comprise a combination of azimuthally (or concentric) temperature control elements and radially extending temperature control elements.

Figure 6A:
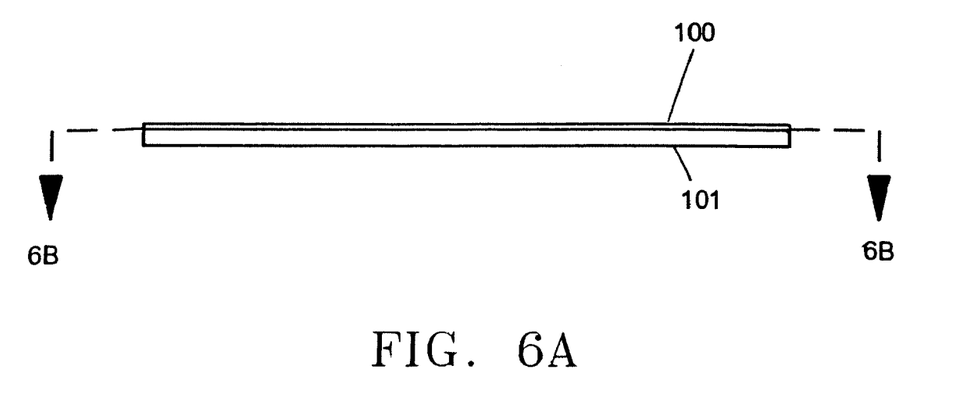
FIG. 6A is a side view of a substrate holder according to another embodiment of the present invention.
Figure 6B:
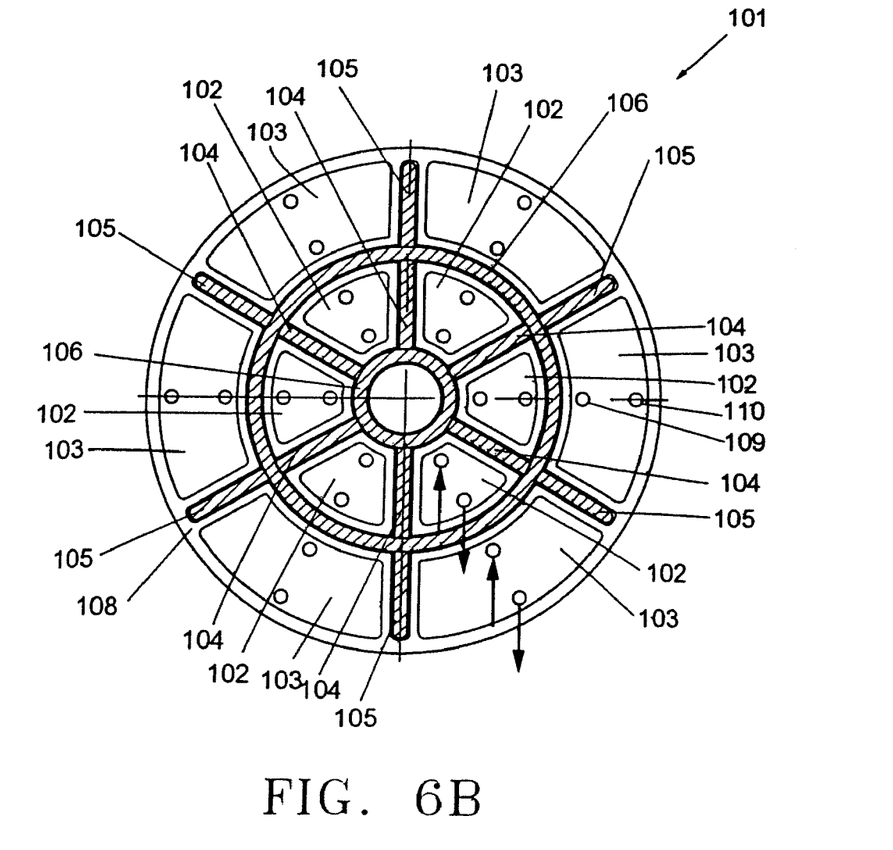
FIG. 6B is a cross-sectional view of a substrate holder according to another embodiment of the present invention.

An alternate arrangement of the present invention is shown in FIG. 6A. FIG. 6B is an exemplary quartz substrate holder as described in U.S. patent application Ser. No. 10/088,504 filed on Mar. 28, 2002, which is herein incorporated by reference. A set of substrate holder layers including an upper layer 100 and a lower layer 101 are shown. The upper layer 100 can comprise a cylindrical plate (or cover plate). The lower layer 101 includes a plurality of cooling strips including inner cooling strips 102 and outer cooling strips 103. Furthermore, the lower layer 101 includes insulating strips including inner insulating strips 104, outer insulating strips 105, and concentric insulating strips 106, each of which reside within receiving features formed within lower plate 101. The receiving features can be machined using techniques well known to those skilled in the art of machining quartz.

Support structures 108 align each face with the other. When aligned, the insulating strips 104, 105 fit within the inner cooling strips 102 and the outer insulating strips 103. Therefore, the insulating strips 104, 105 form thermal insulating zones within the cooling strips 102, 103. Once the cooling channels 102, 103, and the receiving features for insulating strips 104, 105, 106 are machined, and the insulating strips are inserted within the receiving features, the upper layer 100 can be coupled to the lower layer 101. For example, the coupling between upper layer 100 and lower layer can be achieved using fusion bonding as is known to skilled in the art of bonding quartz.

Still referring to FIG. 6B, the pattern of the cooling channel is shown whereby particular sections of the substrate holder are cooled by localized cooling systems. Particularly inner cooling strip 102 is substantially trapezoidal shaped. Thus it is narrow at the center of the substrate holder and becomes wider as the strip extends towards the outer sections of the substrate holder. Coolant for the cooling strips enters the cooling strip of the inlets 109 and is pumped out by outlets 110.

Alternately, where it is impractical to attempt to install thermal zones into a substrate holder, as in some of the arrangements of cooling strips in U.S. patent application Ser. No. 10/088,504 filed on Mar. 28, 2002, herein incorporated by reference, in which the cooling strips consist of a very narrow passage, the present invention can be modified. In this case the invention installed into the substrate holder would replace substrate holder material between the stripes. This arrangement would therefore be similar to the arrangement discussed above with reference to the aluminum substrate holders.

Because the material used in quartz substrate holders has a low thermal conductivity, it would be necessary for the insulator to have an extremely low thermal conductivity to be effective in preventing heat transfer. Certainly, the gaseous chamber or vacuum discussed above would qualify as potentially effective insulators.

Figure 7A:
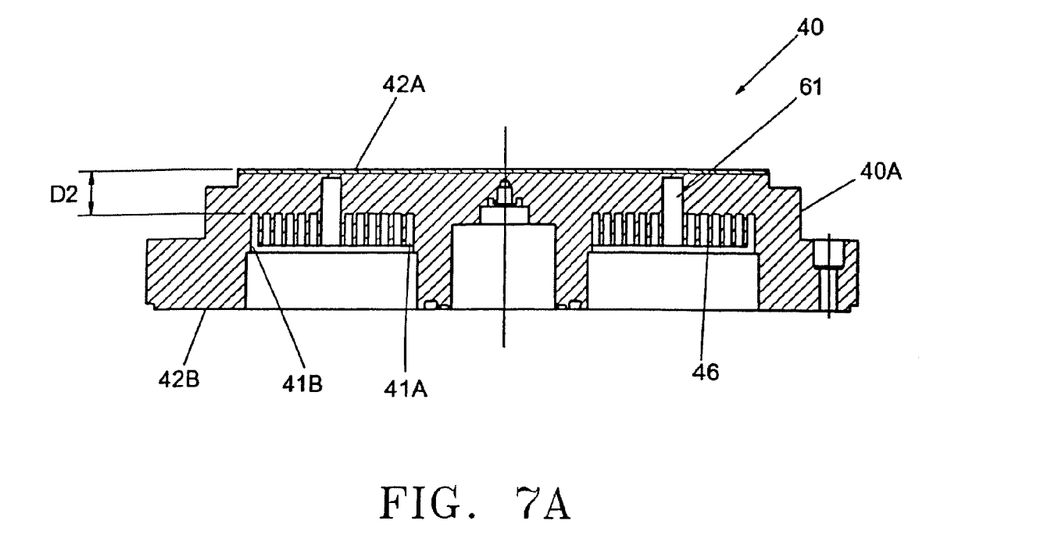
FIGS. 7A-7D illustrate various steps in a manufacturing method of the present invention.

Manufacture of a substrate holder according to one embodiment of the present invention involves generally 4 distinct steps (e.g., as shown in FIGS. 7A-7D). The substrate holder 40 is formed from an upper portion 40A and a lower portion 40B. As illustrated in FIG. 7A, a section of the upper portion 40A of substrate holder 40 is removed to make room for the temperature control elements 41A, 41B (and optionally forming fins 46). Thus, surface 42B must be penetrated such that the section of the substrate holder remaining has a depth, $D_2$ where the temperature control elements 41A, 41B are envisioned. A section 61 of the substrate holder 40 is removed to nearly surface 42a where the insulator 43 is intended to be installed.

Figure 7B:
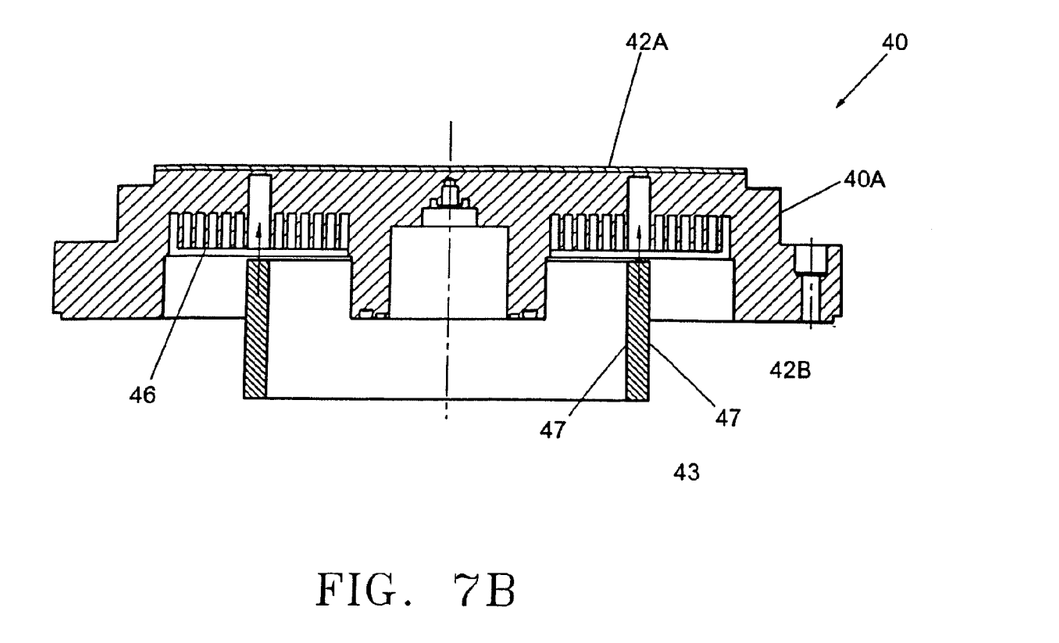

Next, as shown in FIG. 7B, the insulator 43, including an (optional) adhesive 47 is inserted into the space created for it such that the adhesive 47 forms a good seal between the insulator 43 and the substrate holder 40.

Figure 7C:
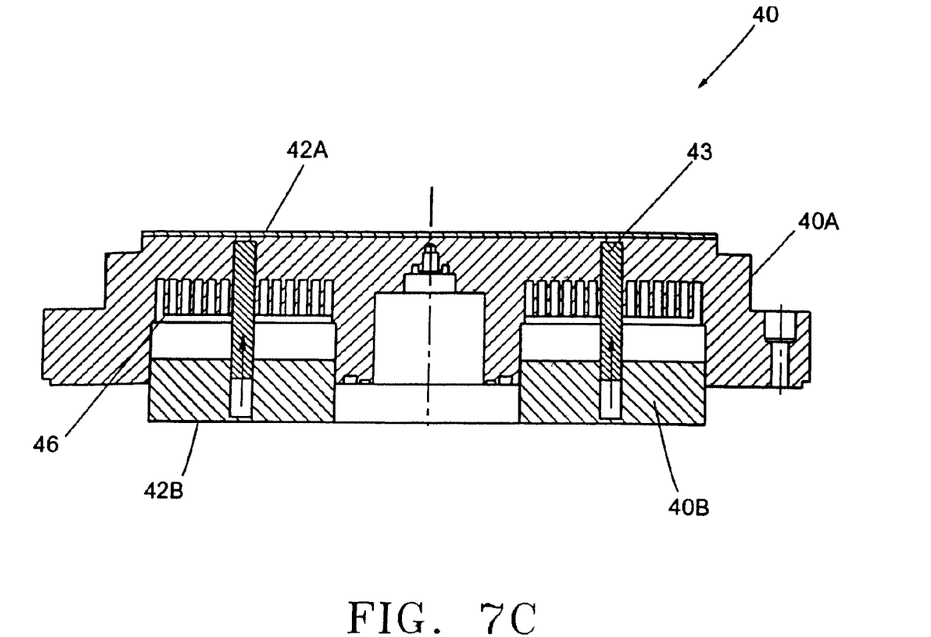
Figure 7D:
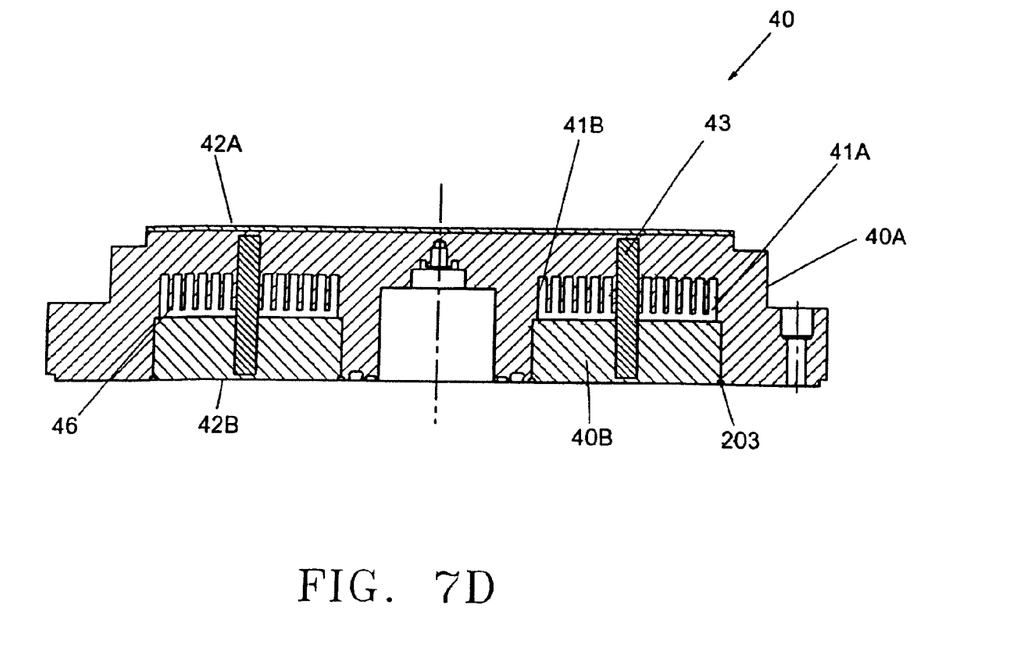

Next, as shown in FIG. 7C, the upper and lower portions 40A and 40B, respectively, the substrate holder 40 are assembled so as to form floors of the temperature control elements 41A, 41B. As shown in FIG. 7D, these portions are then welded to form weld joint 203 on the substrate holder 40 and creating the temperature control elements 41A, 41B.

As a result when assembled, the insulating strips divide the cooling strips into thermal rows. Due to the high number of individual cooling strips, spread across the surface of the substrate holder, the various thermal zones provide an effective means for cooling specific areas of the substrate holder.

Figure 8A:
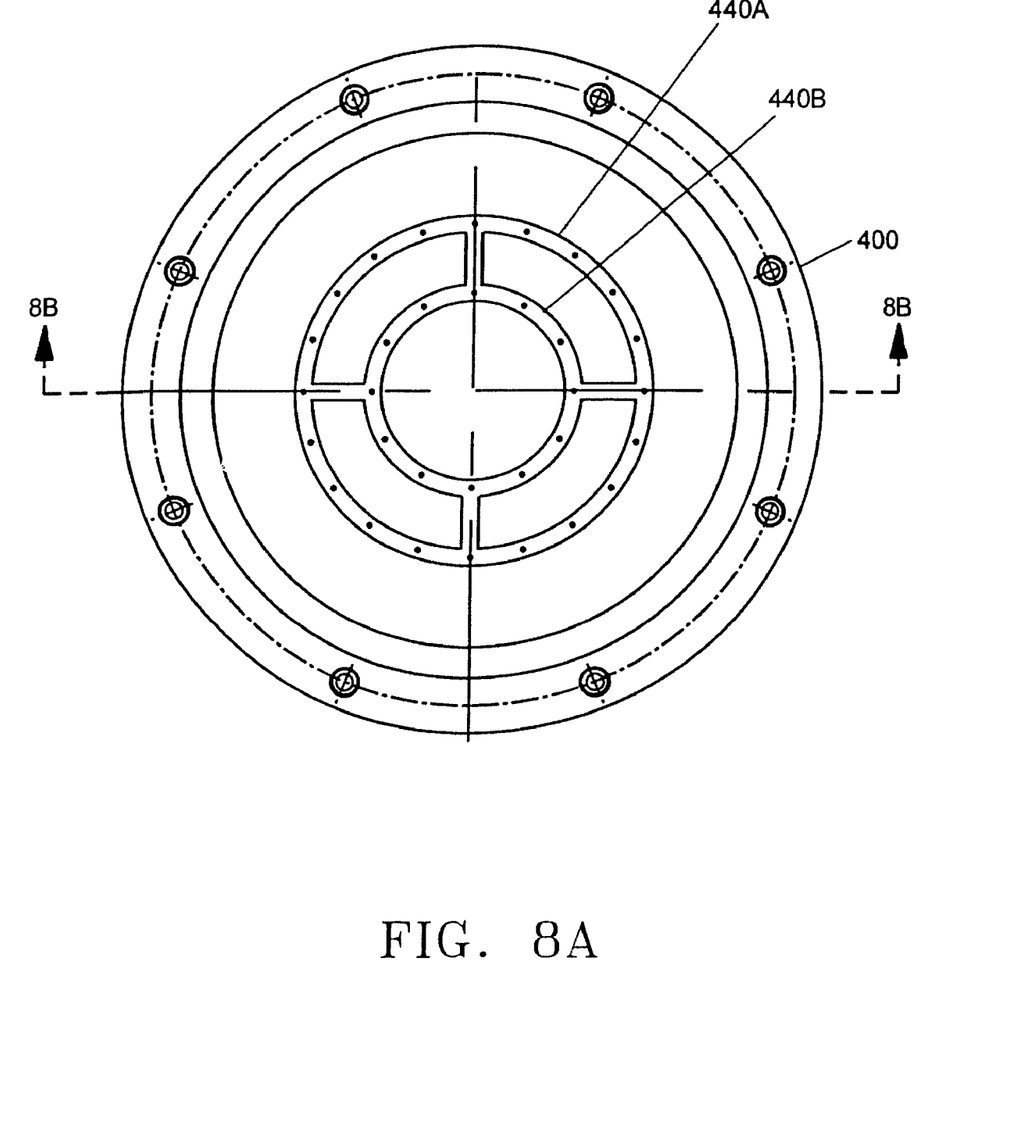
FIGS. 8A-8C illustrate top and cross-sectional views of another embodiment of the present invention.
Figure 8B:
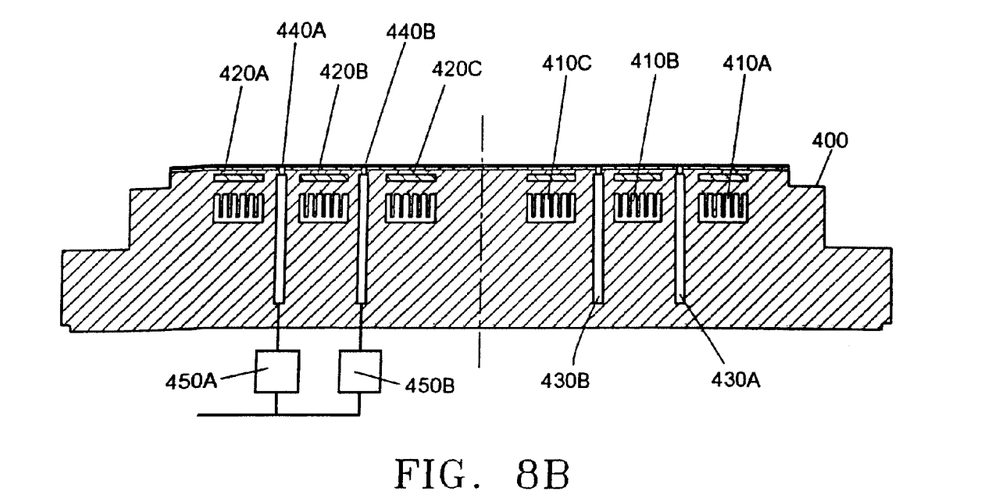

In an alternate embodiment, FIGS. 8A and 8B present a top view and side cross-sectional view of a substrate holder 400. Substrate holder 400 comprises a first array of temperature control elements 410A, 410B, and 410C, and a second array of temperature control elements 420A, 420B, and 420C. The first array of temperature control elements 410A-C can, for example, comprise a fluid channel that permits the passage of a cooled or heated fluid for transferring heat from or to the substrate holder 400, respectively. Additionally, the second array of temperature control elements 420A-C can, for example, comprise an array of thermo-electric elements capable of heating or cooling a substrate depending upon the direction of electrical current flow through the respective elements. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). The second array of temperature control elements 420A-C can be adapted for rapid control of substrate temperature, and, depending upon the direction of heat flow, the first array of temperature control elements 410A-C can be adapted to transfer heat to or remove heat from the backside of the second array of temperature control elements 420A-C. Furthermore, as illustrated in FIG. 8B, substrate holder 400 further comprises one or more thermal insulators 430A, 430B in order to provide thermal insulation between respective temperature control zones. Each thermal insulator 430A, 430B can comprise an annular space coupled to a gas supply through one or more pressure control devices 450A, 450B. Additionally, each annular space can be coupled to at least one of a channel or array of gas distribution orifices 440A, 440B in order to couple a gas supplied to the thermal insulator to the space residing between a back-side surface of the substrate and an upper surface of the substrate holder 400. The gas can, for example, comprise an inert gas such as helium, argon, xenon, a process gas such as CF4, C4F8, C5F8, C4F6, etc., or any other gas such as hydrogen, oxygen, nitrogen, etc. Pressure control devices 450A, 450B can be utilized to control the pressure in the annular space of each thermal insulator 430A, 430B, and the space residing between the back-side of the substrate and the upper surface of the substrate holder 400.

Figure 8C:
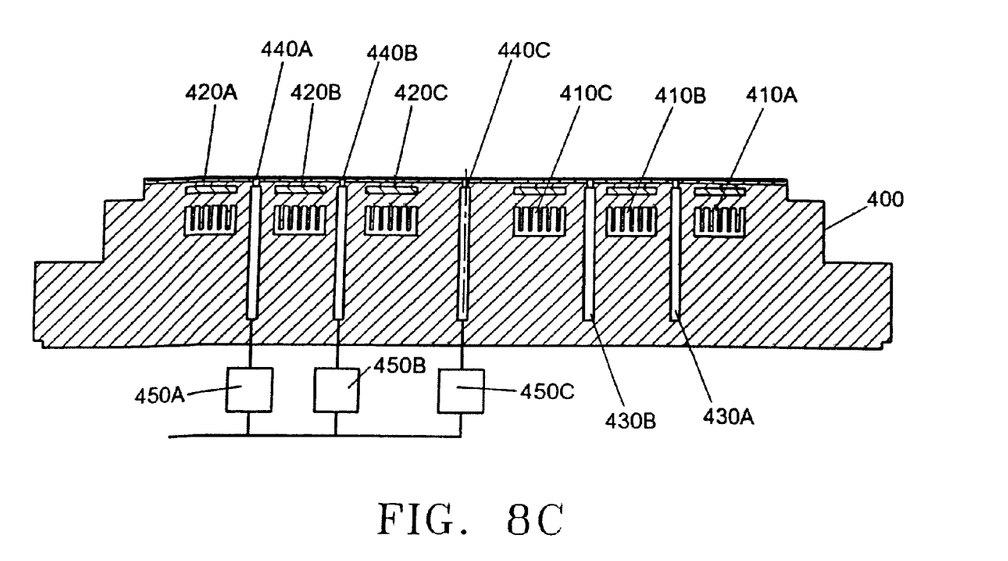

Alternately, as illustrated in FIG. 8C, an additional thermal insulator 430C can be utilized to distribute a gas to the center region of the substrate through an additional pressure control device 450C.

Alternately, each thermal insulator 430A, 430B, and 430C is coupled to a single gas supply device with a single pressure control device.

As would be understood by one of ordinary skill in the art, the application of gas to the backside of a wafer via thermal insulators is not limited to the embodiment of FIGS. 8A-8C. Any of FIGS. 1-7 can be modified to include at least one thermal insulator 430 in addition to or in place of their corresponding illustrated insulators.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A thermally zoned substrate holder for a processing system, comprising:
    a substrate holder having a top surface configured to support a substrate and a bottom surface opposing said top surface, wherein said substrate holder comprises two or more concentric thermal zones;
    a first concentric array of temperature control elements disposed within said substrate holder and located beneath said top surface such that each temperature control element of said first concentric array is positioned within one of said two or more concentric thermal zones and each of said two or more concentric thermal zones includes at least one temperature control element of the first concentric array, wherein each temperature control element of the first concentric array comprises a channel which extends circumferentially about a center of the top surface and which is configured to circulate a temperature control fluid;
    a second concentric array of temperature control elements disposed within said substrate holder beneath said top surface and above said first concentric array of temperature control elements such that each temperature control element of said second concentric array is positioned within one of said two or more concentric thermal zones and and each of said two or more concentric thermal zones includes at least one temperature control element of the second concentric array, wherein each temperature control element of the second concentric array comprises either a resistive heating element or a thermoelectric cooling element, or both a resistive heating element and a thermoelectric cooling element, and extends circumferentially about the center of said top surface; and
    at least one thermal insulator extending circumferentially about the center of said top surface and is interposed radially between adjacent concentric thermal zones, wherein said at least one thermal insulator comprises an annular plenum space extending in a direction from said top surface to said bottom surface of said substrate holder such that the thermal insulator is positioned between adjacent first temperature control elements and positioned between adjacent second temperature control elements, and wherein said annular plenum space is configured to receive a gas from a gas supply through one or more pressure control devices and to distribute said gas through a plurality of openings in said top surface to the backside of the substrate.

2. The thermally zoned substrate holder as recited in claim 1, wherein said first concentric array of temperature control elements is positioned within said substrate holder in a plane substantially equidistant from said top surface and said bottom surface.

3. The thermally zoned substrate holder as recited in claim 1, wherein said at least one insulator extends from a location substantially near said top surface to another location substantially near said bottom surface.

4. The thermally zoned substrate holder as recited in claim 1, wherein said first concentric array of temperature control elements comprises two or more cooling elements that are concentrically arranged, each cooling element comprising a channel configured to circulate a cooling fluid.

5. The thermally zoned substrate holder as recited in claim 1, wherein said second concentric array of temperature control elements comprises two or more heating elements that are concentrically arranged.

6. The thermally zoned substrate holder as recited in claim 1, wherein said top surface is substantially parallel to said bottom surface.

7. The thermally zoned substrate holder as recited in claim 1, wherein each of said channels is configured to independently circulate a separate fluid at a reduced temperature or an elevated temperature or both.

8. The thermally zoned substrate holder as recited in claim 1, wherein said second array of temperature control elements comprises two or more resistive heating elements that are concentrically arranged.

9. The thermally zoned substrate holder as recited in claim 1, wherein said at least one thermal insulator comprises a plurality of thermal insulators each located between an adjacent pair of said concentric thermal zones.

10. The thermally zoned substrate holder as recited in claim 9, wherein said at least one thermal insulator further comprises a thermal insulator located at said center of the top surface of said substrate holder.

11. The thermally zoned substrate holder as recited in claim 1, wherein said plurality of openings comprises plural arrays of openings formed in said top surface.

12. The thermally zoned substrate holder as recited in claim 11, wherein each array of openings is concentrically arranged above each thermal insulator and configured to supply said gas from said annular space corresponding to each thermal insulator to a circular channel formed in said top surface.

13. The thermally zoned substrate holder as recited in claim 12, wherein each circular channel is coupled to one another by at least one radially extending channel formed in said top surface.

14. The thermally zoned substrate holder as recited in claim 1, wherein said one or more pressure control devices comprise a pressure control device independently coupled to said annular space for each of said at least one thermal insulators.

15. The thermally zoned substrate holder as recited in claim 14, wherein each of said pressure control devices independently controls gas pressure to a respective one of said thermal insulators in order to provide a temperature gradient across said concentric thermal zones.

16. The thermally zoned substrate holder as recited in claim 1, wherein:
said one or more pressure control devices comprises two or more pressure control devices,
said at least one thermal insulator comprises at least two thermal insulators each comprising an annular space extending in a direction from said top surface to said bottom surface and configured to receive a gas from a gas supply through a respective one of said two or more pressure control devices and to distribute said gas through said top surface to the backside of said substrate, each of said thermal insulators distributing said gas to a different one of said concentric thermal zones at the backside of said substrate, and
said two or more pressure control devices each independently control gas pressure to a respective one of said at least two thermal insulators in order to provide a temperature gradient across said concentric thermal zones.

17. The thermally zoned substrate holder as recited in claim 1, wherein said top surface of said substrate holder has a larger area than a substrate to be placed thereon such that said substrate does not overhang said top surface when placed thereon.

18. The thermally zoned substrate holder as recited in claim 1, wherein at least one temperature control element in said first concentric array of temperature control elements comprises fin projections.

19. A substrate holder for supporting a substrate in a processing system and controlling the temperature thereof, comprising:
a first heating element arranged in a first thermal zone of said substrate holder beneath a top surface of said substrate holder, and configured to raise the temperature in said first thermal zone;
a second heating element arranged in a second thermal zone of said substrate holder beneath said top surface of said substrate holder, and configured to raise the temperature in said second thermal zone;
a first cooling element arranged in said substrate holder beneath said first heating element in said first thermal zone;
a second cooling element arranged in said substrate holder beneath said second heating element in said second thermal zone; and
a thermal insulator arranged in said substrate holder interposed radially between said first thermal zone and said second thermal zone, wherein said thermal insulator comprises an annular plenum space extending from a location substantially near said top surface, through a region of the substrate holder between the first and second heating elements and between the first and second cooling elements, to another location substantially near a bottom surface of said substrate holder, wherein said annular space is configured to receive a gas from a gas supply through one or more pressure control devices and to distribute said gas through a plurality of openings in said top surface at the backside of said substrate and wherein the first and second heating elements, the first and second cooling elements and the thermal insulator each extend circumferentially about a center of said top surface and are concentrically arranged such that the thermal insulator is positioned between adjacent first and second heating elements and between adjacent first and second cooling elements.

20. The substrate holder as recited in claim 19, wherein each of said first heating element and said second heating element comprise a resistive heating element, and wherein each of said first cooling element and said second cooling element comprise a fluid channel through which a fluid is circulated.

21. The substrate holder as recited in claim 19, wherein said annular space supplies said gas to the backside of said substrate through a circular array of openings.

22. The substrate holder as recited in claim 21, wherein said circular array of openings supplies said gas to a circular channel formed in said top surface.

23. The substrate holder as recited in claim 19, wherein said top surface of said substrate holder has a larger area than a substrate to be placed thereon such that said substrate does not overhang said top surface when placed thereon.

24. The substrate holder as recited in claim 19, wherein at least one of said first cooling element or said second cooling element comprises fin projections.

* * * * *